(12) United States Patent
Park et al.

(10) Patent No.: US 6,723,655 B2
(45) Date of Patent: Apr. 20, 2004

(54) METHODS FOR FABRICATING A SEMICONDUCTOR DEVICE

(75) Inventors: Hyung Soon Park, Kyoungki-do (KR); Jong Goo Jung, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/180,201

(22) Filed: Jun. 25, 2002

(65) Prior Publication Data

US 2003/0003718 A1 Jan. 2, 2003

(30) Foreign Application Priority Data

Jun. 29, 2001 (KR) .................... 10-2001-38264
Jun. 20, 2002 (KR) .................... 10-2002-34697

(51) Int. Cl.$^7$ .................... H01L 21/302; H01L 21/461
(52) U.S. Cl. .................... 438/742; 438/691; 438/737; 438/738; 438/740; 438/720; 438/959
(58) Field of Search .................... 438/691, 720, 438/737, 738, 740, 742, 959

(56) References Cited

U.S. PATENT DOCUMENTS

| | | | |
|---|---|---|---|
| 5,356,833 A | | 10/1994 | Maniar et al. |
| 5,891,205 A | | 4/1999 | Picardi et al. |
| 5,934,980 A | * | 8/1999 | Koos et al. .................... 438/692 |
| 5,968,710 A | | 10/1999 | Whitman et al. |
| 5,977,583 A | * | 11/1999 | Hosotani et al. .................... 257/311 |
| 6,069,081 A | | 5/2000 | Kelleher et al. |
| 6,177,320 B1 | | 1/2001 | Cho et al. |
| 6,180,450 B1 | | 1/2001 | Dennison et al. |
| 6,200,875 B1 | | 3/2001 | Jang et al. |
| 6,232,228 B1 | | 5/2001 | Kwag et al. |
| 6,248,667 B1 | | 6/2001 | Kim et al. |
| 6,271,075 B1 | | 8/2001 | Fukui |
| 6,281,541 B1 | | 8/2001 | Hu |
| 6,287,905 B2 | * | 9/2001 | Kim et al. .................... 438/197 |
| 6,319,789 B1 | | 11/2001 | Carstensen |
| 6,387,759 B1 | | 5/2002 | Park et al. |
| 6,395,644 B1 | * | 5/2002 | Hopper et al. .................... 438/199 |
| 6,431,185 B1 | | 8/2002 | Tomita et al. |
| 6,562,651 B2 | * | 5/2003 | Chung et al. .................... 438/98 |
| 2003/0148614 A1 | * | 8/2003 | Simpson et al. .................... 438/692 |

FOREIGN PATENT DOCUMENTS

KR     1020010022101 A     11/2002

* cited by examiner

Primary Examiner—John F. Niebling
Assistant Examiner—Jennifer M. Kennedy
(74) Attorney, Agent, or Firm—Townsend and Townsend and Crew, LLP

(57) ABSTRACT

The present invention discloses methods for fabricating a semiconductor device. In one embodiment, a conductive interconnection is formed on a semiconductor substrate to overlap with a mask insulating film pattern. An insulating film spacer is formed at side walls of the pattern, a high temperature oxide layer is formed on the resultant structure, and an interlayer insulating film is formed on the HTO film to planarize the surface of the resultant structure. Storage electrode and bit line contact holes are formed to expose the semiconductor substrate, by etching the interlayer insulating film according to a photolithography process using a contact mask. A landing plug poly is formed by depositing a conductive layer for a contact plug to fill up the contact holes. A first CMP process for etching the conductive layer and the interlayer insulating film by a predetermined thickness is performed using a basic slurry, and a second CMP process of polishing the conductive layer for a contact plug and the interlayer insulating film by using a acid slurry is performed to expose the upper portion of the mask insulating film pattern, thereby forming the contact plug.

13 Claims, 10 Drawing Sheets

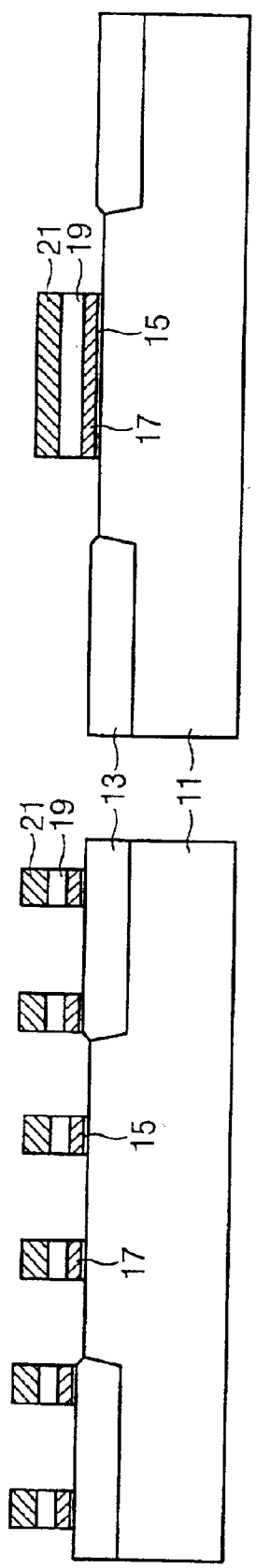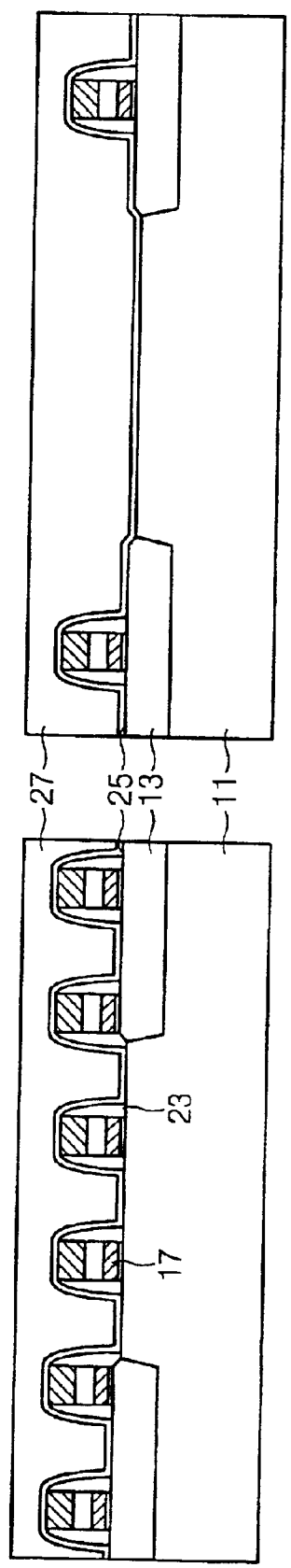

METHODS FOR FABRICATING A SEMICONDUCTOR DEVICE

BACKGROUND OF THE INVENTION

1. Field of the Invention

The present invention relates to methods for fabricating a semiconductor device, and in particular to a technology for preventing dishing of a dielectric film which serves as an insulating film in a chemical mechanical polishing (CMP) process of a conductive layer for a contact plug.

2. Description of the Background Art

A conventional CMP process isolates a plug by using a basic slurry. A nitride film is typically used as a hard mask layer of a word line, and an oxide film is typically used as a planarization and gap fill material. In a polishing process of a plug material, the plug material and the oxide film are dished more than the nitride film due to differences in an etching selectivity ratio of the three materials. It is thus necessary to deposit additional oxide film.

When CMP process residues fall into the dished region of the plug material and the oxide film, the residues may not be removed in a succeeding cleaning process. As a result, a bridge may be generated between a bit line contact plug and a storage electrode contact plug. Such a bridge undesirably reduces device yield.

FIGS. 1 and 2 are diagrams for explaining disadvantages of a conventional method for fabricating a semiconductor device.

Referring to FIG. 1, a word line is formed having a mask insulating film pattern composed of a nitride film at its upper portion, and a nitride film spacer at its side walls. An interlayer insulating film composed of BPSG is formed to planarize the upper portion of the resultant structure. A storage electrode contact hole and a bit line contact hole are formed by etching the interlayer insulating film in a self aligned type according to a photolithography process using an exposure mask for forming the storage electrode contact hole and the bit line contact hole. A conductive layer is formed over the resultant structure, filling up the contact holes. The conductive layer is etched to expose the interlayer insulating film, and a contact plug is formed by performing the CMP process until the mask insulating film is exposed.

Here, the CMP process is performed by using differences in an etching selectivity ratio of the nitride film, which is the mask insulating film, the BPSG, which is the silicon oxide film, and the conductive layer for the contact plug.

In FIG. 1, (a) denotes dished regions of the conductive layer for the contact plug due to over-etching in the CMP process. Also in FIG. 1, (b) denotes dished regions of the BPSG, which is the interlayer insulating film, due to over-etching in the CMP process.

FIG. 2 is a photograph showing device failure generated due to the dishing of FIG. 1. The bit line contact plug and the storage electrode contact plug are shorted out in a succeeding process by residues generated in the CMP process of a landing plug poly (LPP).

In FIG. 2, (c) denotes column failure and (d) denotes bit failure.

As described above, the conventional method for fabricating semiconductor devices has a disadvantage in that a property and yield of the device are deteriorated due to dishing effects.

BRIEF SUMMARY OF THE INVENTION

Accordingly, the present invention provides methods for fabricating a semiconductor device which can improve a property, reliability and a yield of the semiconductor device by reducing dishing in a CMP process for forming a contact plug. In one embodiment, the fabrication method includes performing a first CMP process using a basic slurry having a higher polishing speed to a silicon layer and an oxide film than to a nitride film, and performing a second CMP process using an acid slurry to decrease the dishing.

One such method for fabricating a semiconductor device according to the present invention includes forming a gate insulating film on a semiconductor substrate, and forming a conductive interconnection on the gate insulating film to overlap with a mask insulating film pattern composed of a nitride film. An insulating film spacer is formed at the side walls of the conductive interconnection and the mask insulating film pattern. An interlayer insulating film consisting of an oxide film is formed to planarize the surface of the resultant structure. A storage electrode contact hole and a bit line contact hole are formed to expose the semiconductor substrate by etching the interlayer insulating film and the oxide film according to a photolithography process using a contact mask. The method further includes forming a contact plug consisting of silicon to fill the contact holes, performing a first CMP process using a basic slurry to etch the contact plug and the interlayer insulating film by a predetermined thickness, and performing a second CMP process using an acid slurry to etch the contact plug and the interlayer insulating film, thereby exposing the mask insulating film pattern.

In one aspect of the present invention, the basic slurry has pH 6~12, and the acidic slurry has pH 6 and below. In addition, the acid slurry has the polishing selectivity (silicon layer/oxide film layer) of 0.5~2.

In another aspect of the present invention, an antireflection film composed of a silicon oxide nitride film (SiON) is formed on the mask insulating film, and an organic bottom antireflection film is formed on the conductive interconnection.

In yet another aspect of the present invention, the contact plug includes amorphous silicon, polysilicon or epitaxially-grown silicon, and is landed in a circular shape or a T-shape.

In still another aspect of the present invention, the CMP process is performed using the acidic slurry of pH 6 and below only.

BRIEF DESCRIPTION OF THE DRAWINGS

The present invention will become better understood with reference to the accompanying drawings which are provided only for illustration and thus are not limitative of the present invention, wherein:

FIGS. 3 through 7 are cross-sectional diagrams illustrating sequential steps of a method for fabricating a semiconductor device in accordance with a preferred embodiment of the present invention;

DETAILED DESCRIPTION OF THE INVENTION

Figure 1:
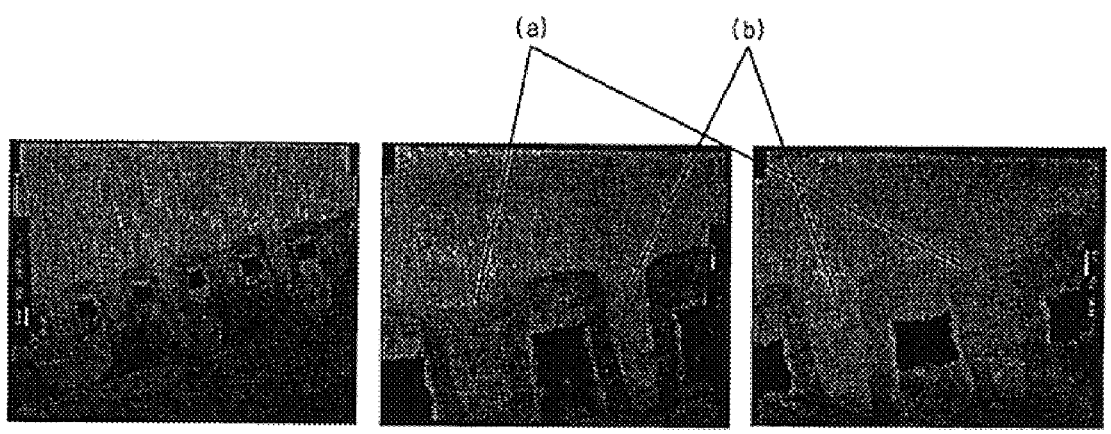
FIG. 1 is an SEM photograph in a state where dishing is generated in the fabrication of a conventional semiconductor device.
Figure 2:
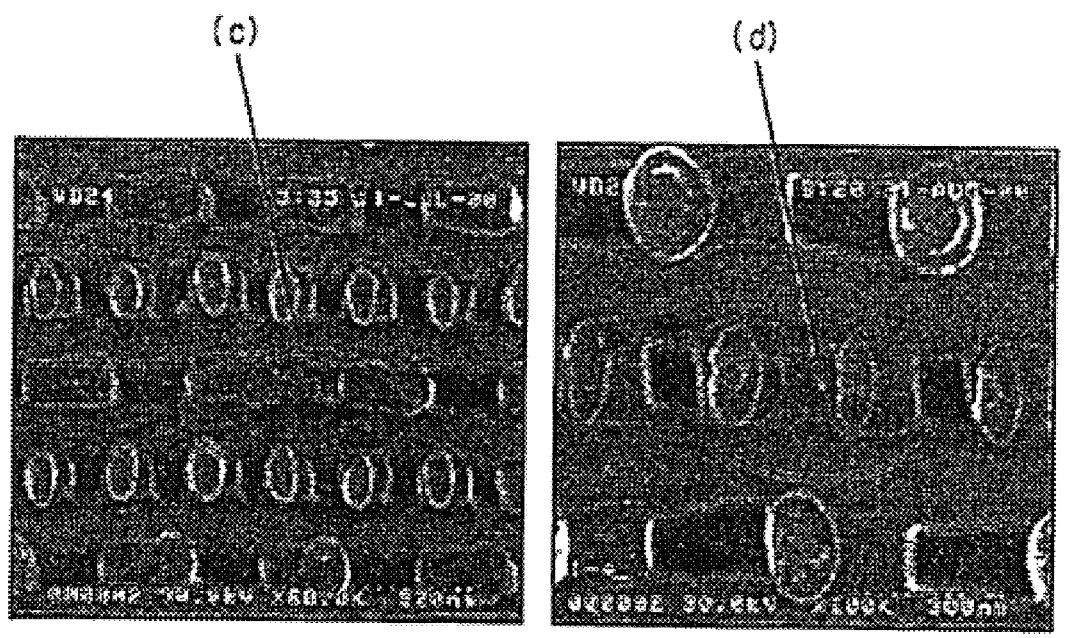
FIG. 2 is a detailed photograph showing failure regions generated in the formation of a bit line by dishing.
Figure 3A:
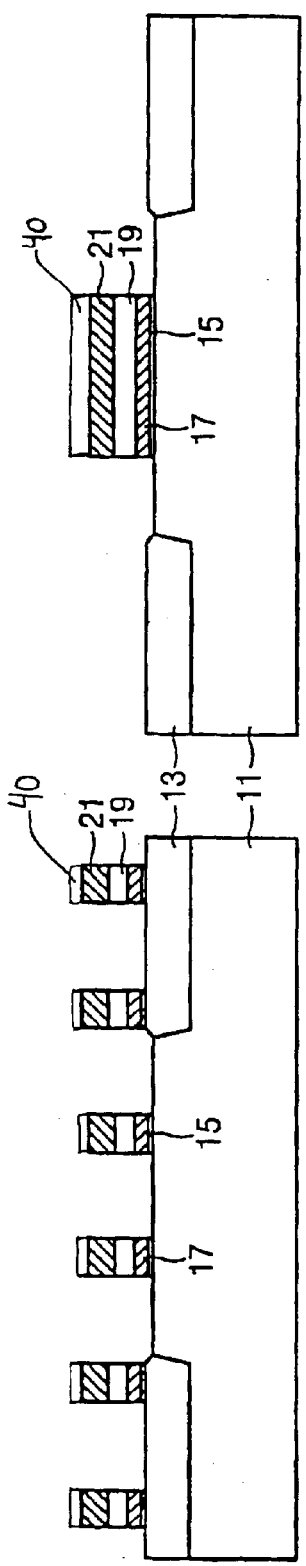
FIGS. 3A and 3B are diagrams illustrating steps for alternative methods for fabricating a semiconductor device in accordance with embodiments of the present invention.
Figure 3B:
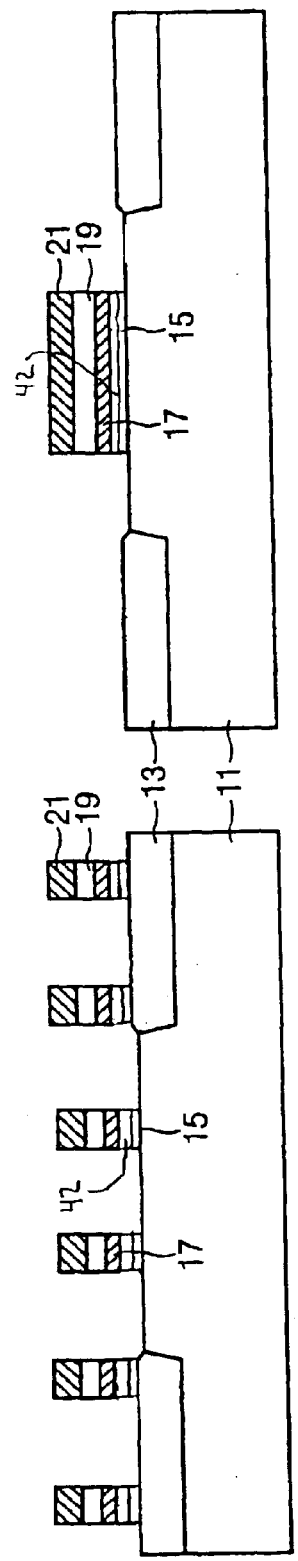
Figure 5:
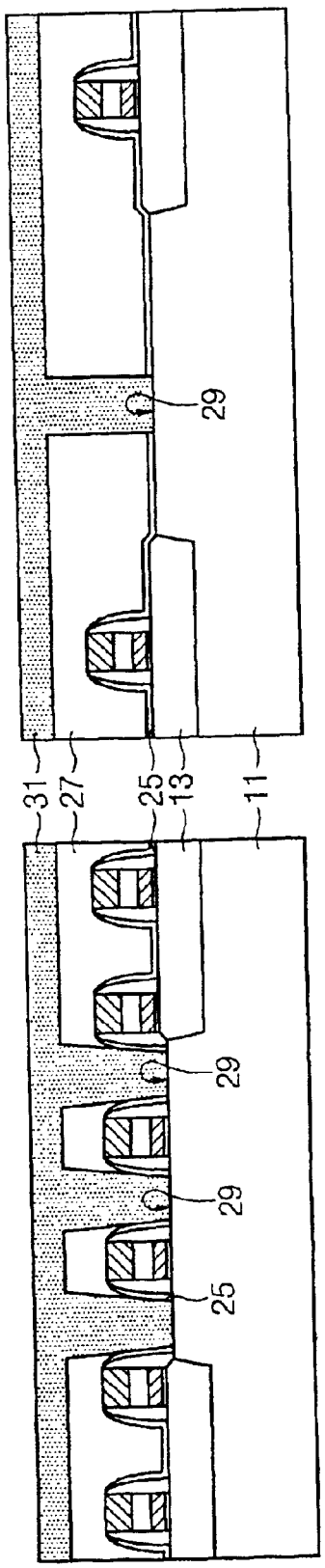
Figure 6:
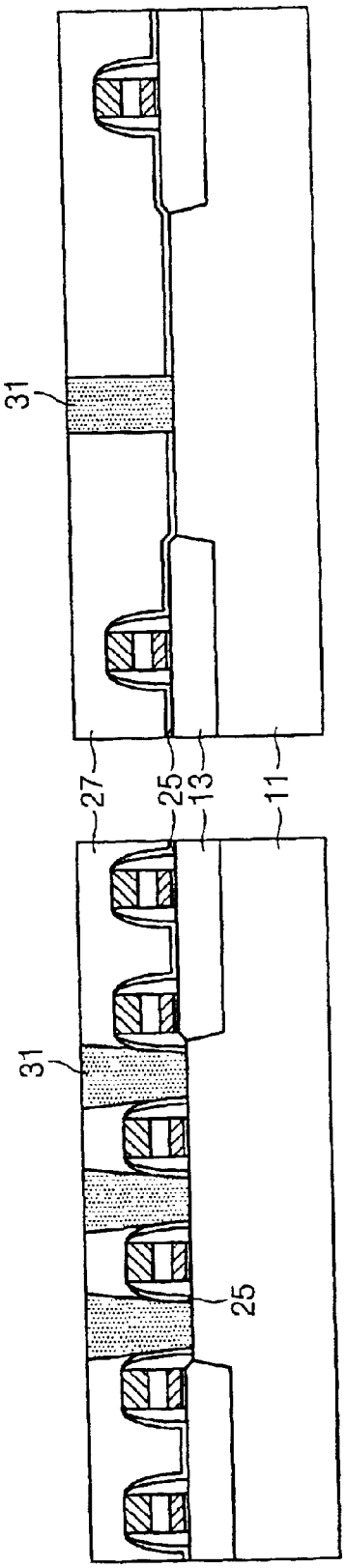
Figure 7:
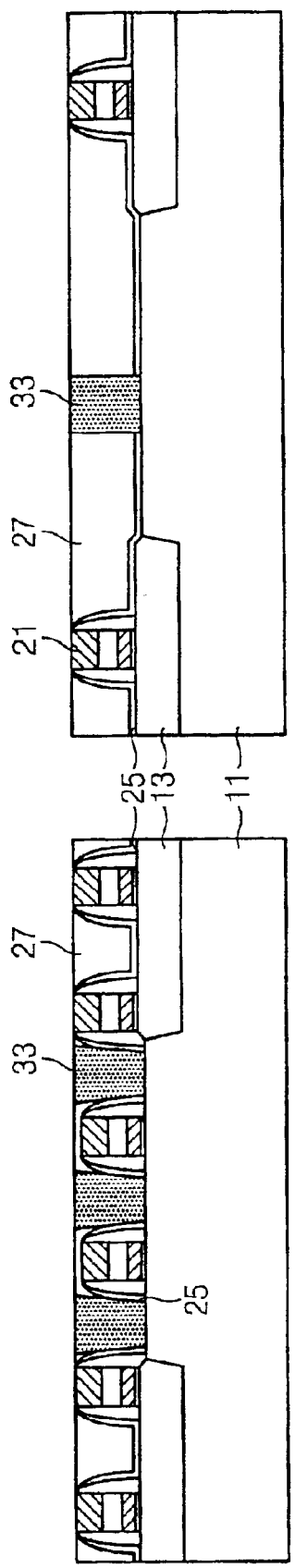

A method for fabricating a semiconductor device in accordance with an embodiment of the present invention will now be described in detail with reference to the accompanying drawings.

FIGS. 3 through 7 are cross-sectional diagrams illustrating sequential steps of a method for fabricating the semiconductor device in accordance with a preferred embodiment of the present invention.

An element isolating film 13 defining an active region is formed on a semiconductor substrate 11, and a gate oxide film 15 is formed over the resultant structure. A conductive layer for a gate electrode is formed on the gate oxide film 15. In one embodiment, the conductive layer for the gate electrode has a stacked structure comprising a doped polysilicon layer 17 and a tungsten silicide layer 19.

A mask insulating film 21 is formed on the conductive layer for the gate electrode. In one embodiment, the mask insulating film 21 is composed of a nitride film, although other compositions of film 21 are within the scope of the present invention. Thereafter, a gate electrode having a stacked structure of the mask insulating film pattern and the conductive patterns 17 and 19 for the gate electrode is formed in accordance with a photolithography process using a gate electrode mask.

In one embodiment, an antireflection film (not shown) composed of a silicon oxide nitride film (SiON) 40 can be formed on the mask insulating film 21. In another embodiment, the antireflection film can be formed as an organic bottom antireflection film 42 at the lower portion of the gate electrode (see FIG. 3).

An insulating film spacer 23 is formed at side walls of the gate electrode, which again may comprise conductive pattern(s) 17, 19. A high temperature oxide (HTO) layer 25 is formed over the resultant structure, and an interlayer insulating film 27 consisting of an oxide film is formed to planarize the upper surface of the resultant structure (see FIG. 4).

Contact holes 29 are formed to expose the semiconductor substrate 11 by etching predetermined regions where a storage electrode and bit line contact is to be formed. A conductive layer 31 is formed over the resultant structure, filling up the contact holes 29 for forming a contact plug. Conductive layer 31 is evenly etched to expose the interlayer insulating film 27 by using differences in an etching selectivity ratio of the conductive layer 31 and the interlayer insulating film 27 (see FIG. 5).

Here, the conductive layer 31 for the contact plug may be formed of an epitaxially-grown silicon film, amorphous silicon film, a polysilicon film or the like.

A first CMP process is performed to polish the interlayer insulating film 27 and the conductive layer 31 for the contact plug by a predetermined thickness. In one embodiment, the first CMP process is carried out by using a basic slurry of pH 6~12 having a higher etching speed to a silicon layer and an oxide film than to a nitride film (see FIG. 6).

Thereafter, a second CMP process is performed on the interlayer insulating film 27 and the conductive layer 31 for the contact plug to expose the mask insulating film 21. In this manner, a contact plug 33 is formed from conductive layer 31. In one embodiment, the second CMP process is carried out by using an acid slurry having a 0.5~2 of polishing selectivity of a silicon layer to an oxide layer film (see FIG. 7).

Figure 8:
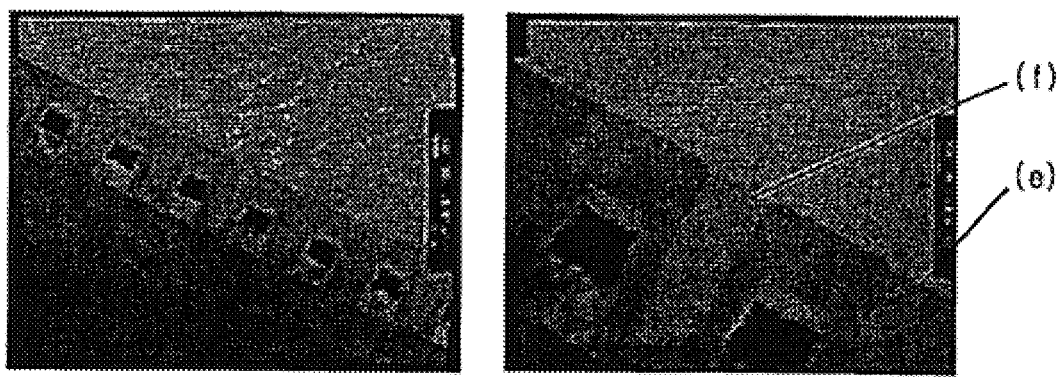
FIG. 8 is an SEM photograph after forming a contact plug of the semiconductor device in accordance with the present invention.

FIG. 8 is a SEM photograph taken after forming the contact plug of the semiconductor device according to the above-described CMP processes.

Here, (e) denotes the contact plug 33 with almost no dishing, and (f) denotes the interlayer insulating film 27 with almost no dishing.

Figure 9:
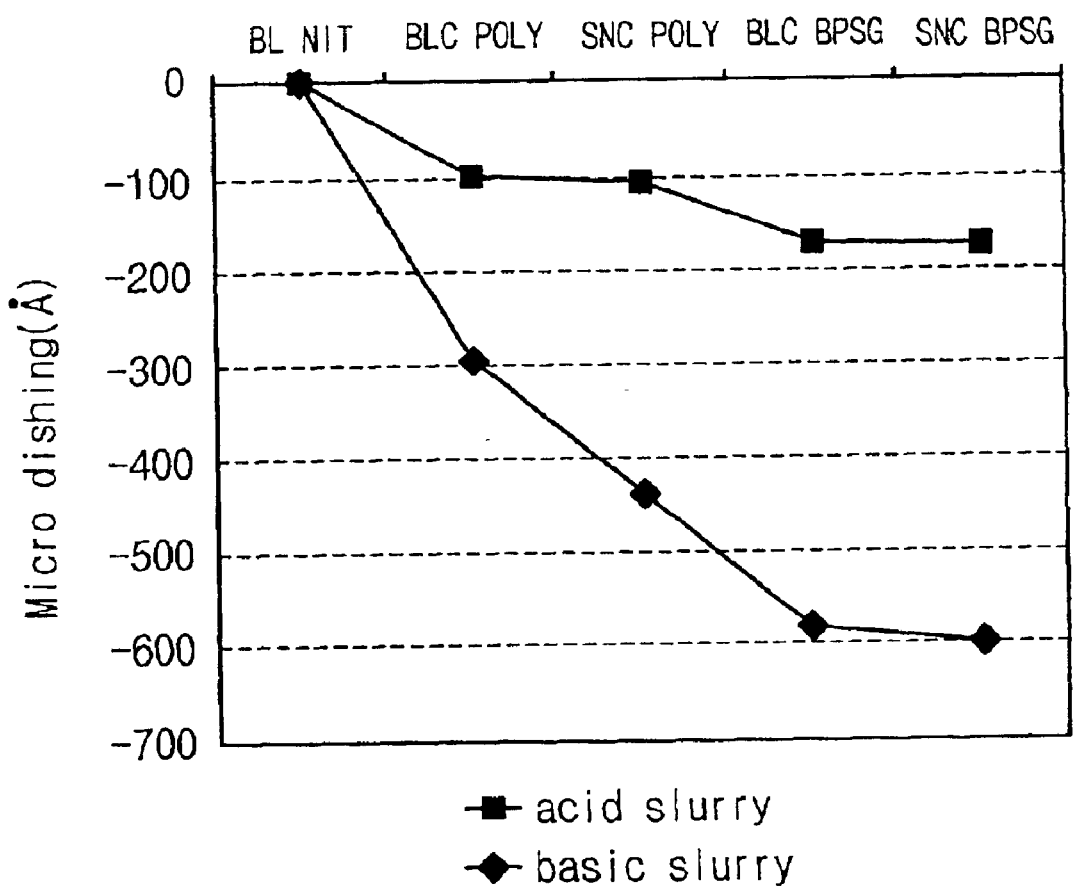
FIGS. 9 and 10 are graphs for explaining effects of the present invention.
Figure 10:
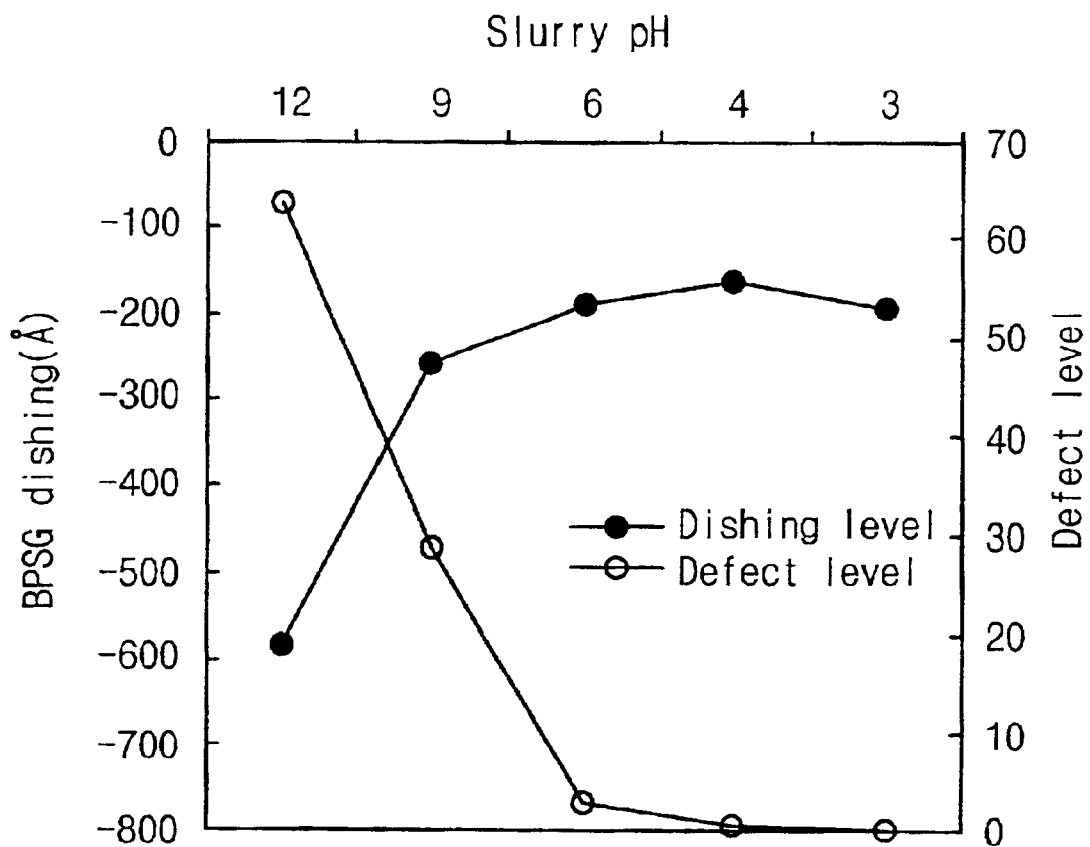

FIGS. 9 and 10 are graphs showing improvements in a dishing level and a defect level in accordance with the present invention.

FIG. 9 is the graph showing the dishing level after the CMP process of an LPP by using the acidic and basic slurry. In particular, FIG. 9 reveals the dishing difference of the nitride film (BL NIT), the bit line contact poly (BLC POLY), the storage electrode contact poly (SNC POLY), the bit line contact interlayer insulating film (BLC BPSG) and the storage electrode contact interlayer insulating film (SNC BPSG), when the acid slurry (-■-) and the basic slurry (-♦-) are used in the CMP process, respectively. As can be seen, dishing effects are mostly lessened by using an acidic slurry according to the present invention.

FIG. 10 is a graph showing the dishing level (-●-) and the pinocchio defect level (-○-) of the BPSG insulating film used as the interlayer insulating film according to pH of the CMP slurry. In particular, FIG. 10 reveals the reduction in the dishing and defect of the interlayer insulating film in accordance with the present invention.

Figure 11:
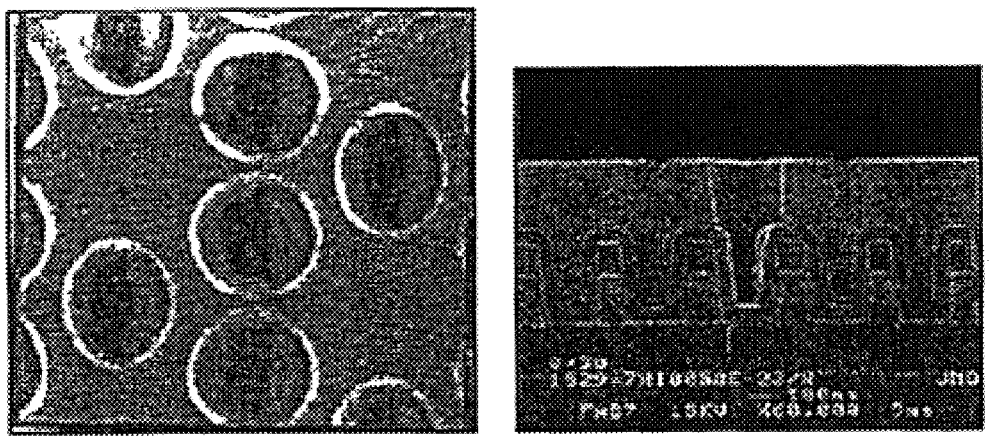
FIGS. 11 and 12 are photographs showing plan and side views of the contact plug designed in the step of FIG. 6.
Figure 12:
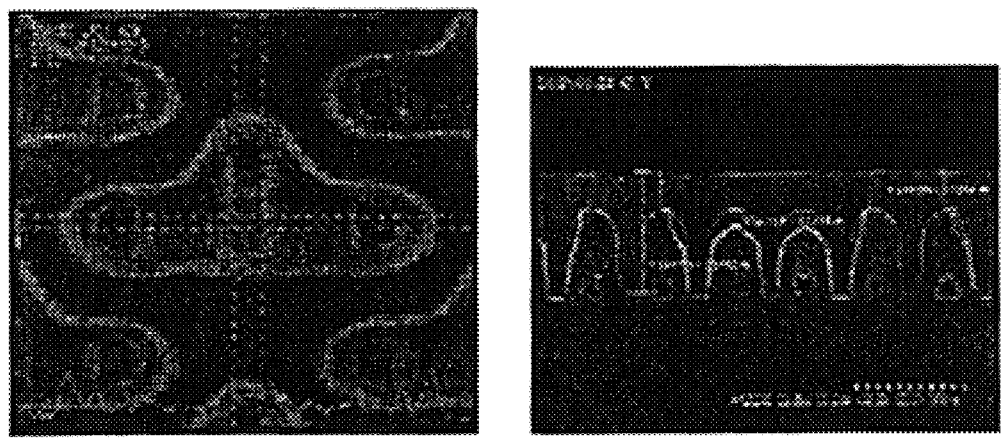

FIGS. 11 and 12 are photographs showing plan and side views of the landing plug in accordance with the present invention. FIG. 11 illustrates a circular landing plug, and FIG. 12 illustrates a T-shaped landing plug.

As discussed earlier, in accordance with the present invention, the property and reliability of the semiconductor device using the landing plug poly are improved by minimizing dishing of the interlayer insulating film and the plug according to the first CMP process using the basic slurry and the second CMP process using the acid slurry. In another embodiment, both the first and second CMP processes use an acid slurry.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for fabricating a semiconductor device, said method comprising:

forming a gate insulating film on a semiconductor substrate;

forming a conductive interconnection on the gate insulating film to overlap with a mask insulating film pattern comprising a nitride film;

forming an insulating film spacer at side walls of the conductive interconnection and the mask insulating film pattern;

forming an interlayer insulating film comprising an oxide film to planarize the surface of the resultant structure;

forming a storage electrode contact hole and a bit line contact hole to expose the semiconductor substrate, by etching the interlayer insulating film and the oxide film according to a photolithography process using a contact mask;

forming a contact plug to fill up the contact holes, the plug comprising silicon;

performing a first CMP process using a basic slurry to etch the contact plug and the interlayer insulating film by a predetermined thickness; and performing a second CMP process using an acid slurry to etch the contact plug and the interlayer insulating film, thereby exposing the mask insulating film pattern;

wherein after the first and second CMP processes the interlayer insulating film pattern has an upper surface substantially devoid of a dishing effect.

2. The method according to claim 1, wherein the basic slurry has a pH between about 6 and about 12 and the acidic slurry has pH 6 and below.

3. The method according to claim 1, wherein the polishing selectivity of silicon layer to oxide film layer of the acid slurry is between about 0.5 and about 2.

4. The method according to claim 1, further comprising forming an antireflection film on the mask insulating film.

5. The method according to claim 4, wherein the antireflection film comprises a silicon oxide nitride (SiON) film.

6. The method according to claim 1, further comprising forming an organic bottom antireflection film on the conductive interconnection.

7. The method according to claim 1, wherein the contact plug comprises one selected from the group consisting of amorphous silicon, polysilicon and epitaxially-grown silicon.

8. The method according to claim 1, wherein said forming a contact plug includes landing said plug in a "T" or circular shape.

9. A method for fabricating a semiconductor device, said method comprising:

forming a gate insulating film on a semiconductor substrate;

forming a conductive interconnection on the gate insulating film to overlap with a mask insulating film pattern composed of a nitride film;

forming an organic bottom antireflection film on the conductive interconnection;

forming an insulating film spacer at side walls of the conductive interconnection and the mask insulating film pattern;

forming an interlayer insulating film consisting of an oxide film to planarize the surface of the resultant structure;

forming a storage electrode contact hole and a bit line contact hole to expose the semiconductor substrate, by etching the interlayer insulating film and the oxide film according to a photolithography process using a contact mask;

forming a silicon contact plug to fill up the contact holes; and performing a CMP process on the contact plug and interlayer insulating film using an acidic slurry, thereby exposing the mask insulating film pattern;

wherein the CMP process comprises a first CMP process using and basic slurry, and a second CMP process using the acidic slurry.

10. The method according to claim 9, wherein the acidic slurry has pH 6 and below.

11. The method as in claim 9, wherein the polishing selectivity of silicon layer to oxide film layer of the acid slurry is between about 0.5 and about 2.

12. The method as in claim 11 wherein after the first and second CMP processes the interlayer insulating film pattern has an upper surface substantially devoid of a dishing effect.

13. The method as in claim 11 wherein after the first and second CMP processes the contact plug has an upper surface substantially devoid of a dishing effect.

* * * * *